US010948905B2

(12) United States Patent
Horn

(10) Patent No.: US 10,948,905 B2
(45) Date of Patent: Mar. 16, 2021

(54) HIGH VOLUME AUTONOMOUS MATERIAL HANDLING SYSTEM TO IMPROVE IC FACTORY THROUGHPUT AND CYCLE TIME

(71) Applicant: Middlesex Industries, SA., Sorengo (RU)

(72) Inventor: George W. Horn, Brissago (CH)

(73) Assignee: Middlesex Industries, SA., Sorengo (CH)

( * ) Notice: Subject to any disclaimer, the term of this patent is extended or adjusted under 35 U.S.C. 154(b) by 0 days.

(21) Appl. No.: 16/436,565

(22) Filed: Jun. 10, 2019

(65) Prior Publication Data

US 2019/0377331 A1    Dec. 12, 2019

Related U.S. Application Data

(60) Provisional application No. 62/683,185, filed on Jun. 11, 2018.

(51) Int. Cl.
*B65G 1/00* (2006.01)
*B65G 37/02* (2006.01)
(Continued)

(52) U.S. Cl.
CPC ......... *G05B 19/4189* (2013.01); *B65G 37/02* (2013.01); *B65G 43/10* (2013.01); *B65G 47/90* (2013.01); *B65G 2207/14* (2013.01)

(58) Field of Classification Search
None
See application file for complete search history.

(56) References Cited

U.S. PATENT DOCUMENTS 4,829,445 A     5/1989  Burney
8,205,558 B2 *  6/2012  Horn ................. H01L 21/67727
                                                        104/91

(Continued)

FOREIGN PATENT DOCUMENTS

WO    WO 2000/071445 A1   11/2000
WO    WO 2001/004741 A1    1/2001

OTHER PUBLICATIONS

International Search Report and Written Opinion of PCT/US2019/036442 dated Aug. 26, 2019, 8 pp.

*Primary Examiner* — Kavel Singh
(74) *Attorney, Agent, or Firm* — Lathrop GPM LLP

(57) ABSTRACT

Asynchronous conveyor networks serving as inter-process transport mechanisms eliminate transport capacity constraints of vehicle-based systems in integrated circuit (IC) manufacturing environments. Demand variability may be buffered without the use of off-line-storage such as stockers. The variability in wait times for transport service is also eliminated. Overall factory cycle times are thus reduced while manufacturing capacity is simultaneously increased. An autonomous conveyor network automated materials handling system combines clean frictionless conveyor principles with a unique network layout to fulfill the logistics requirements of IC manufacturing environments. Mechanical conveyor-to-tool interfaces, also referred to as equipment delivery interfaces (EDi's), bridge the conveyor network to individual tools. An operating software module integrates the functionality of the conveyor network and EDi's. The result is a full capability factory logistics system.

28 Claims, 7 Drawing Sheets

(51) Int. Cl.
*B65G 43/10* (2006.01)
*B65G 47/90* (2006.01)
*G05B 19/418* (2006.01)

(56) References Cited

U.S. PATENT DOCUMENTS

| | | | | |
|---|---|---|---|---|
| 8,225,496 | B2* | 7/2012 | Bachrach | B26F 3/002 |
| | | | | 29/726 |
| 8,272,827 | B2* | 9/2012 | Bufano | H01L 21/67379 |
| | | | | 414/217.1 |
| 9,224,628 | B2* | 12/2015 | Bufano | H01L 21/67276 |
| 9,676,560 | B2* | 6/2017 | Senn | B65G 37/02 |
| 9,809,392 | B2* | 11/2017 | Walter | B65G 37/02 |
| 10,058,964 | B2* | 8/2018 | Spiesshofer | B23Q 7/1426 |
| 2005/0133340 | A1 | 6/2005 | Horn | |
| 2010/0047954 | A1* | 2/2010 | Su | C03B 33/0222 |
| | | | | 438/61 |

\* cited by examiner

HIGH VOLUME AUTONOMOUS MATERIAL HANDLING SYSTEM TO IMPROVE IC FACTORY THROUGHPUT AND CYCLE TIME

CROSS-REFERENCE TO RELATED APPLICATIONS

This application claims the priority of U.S. Provisional Pat. Appl. No. 62/683,185, filed Jun. 11, 2018.

FIELD OF THE DISCLOSURE

The disclosure herein relates generally to the field of conveyor network systems for manufacturing environments and, in particular, a conveyor-based transportation system having plural shunted intra-bay circulating paths, work piece buffers, inter-bay transport paths, and tool interfaces, the conveyor being made up of individually controllable autonomous segments that enable collision-free, frictionless transport of carriers.

BACKGROUND

Contemporary integrated circuit (IC) factories are built with material handling systems designed to automate inter-process substrate movement. These current material handling systems mimic the previously prevalent inter-process manual transporting and handling of substrate carriers. Such systems are based on discrete methods of moving lots, one by one, from tool to tool via automated, discrete robot vehicles called Over Head Transports (OHTs), named for the individual robot vehicles that run on overhead rails carrying the single lots from process tool to process tool. The disadvantage of such discrete transport systems is in their limited capacity as vehicles saturate the shared rail systems. In addition, such systems are also disadvantaged by their inability to sufficiently respond to manufacturing process variabilities, such as a sudden increase in the demand to move work in process (WIP) carriers, and therefore require the use of stopover stockers for overflow. But most importantly, they introduce wait times for work in process to be moved by a robot vehicle, before the transport service is provided to the next process. This wait time is variable, as in a taxi system with limited number of vehicles. These variances introduce uncertainty into manufacturing by themselves, and by multiplying other process variabilities. These variabilities impede factory capacity and increase cycle time.

SUMMARY

The presently disclosed systems and methods introduce asynchronous conveyor networks into IC manufacturing. These conveyor networks serve as inter-process transports, thereby eliminating the transport capacity constraints of vehicle-based systems. Demand variability may be buffered without the use of off-line-storage such as stockers. The variability in wait times for transport service is also eliminated. Overall factory cycle times are thus reduced while manufacturing capacity is simultaneously increased.

While conveyors have been used in IC factories before, an integrated autonomous conveyor network system with direct automated tool interfacing has not been used or understood as a beneficial solution for a standalone factory logistic system for moving carriers directly from and to the associated processes.

The sole accepted design for modern high capacity work in process (WIP) logistics systems today, and in the past twenty years, is the discrete traveling robot, vehicle-based Automated Material Handling System (AMHS), which is designed solely on the principle of automating individual moves of a wafer carrier between process tools. In contrast to such vehicle-based systems, conveyor network logistics is designed using predictions of queueing network theory, with the goal of minimizing manufacturing variability. For the those skilled in the art of the use of AMHS in IC manufacturing, it is not obvious how a conveyor network would be capable of delivering single substrate carriers from varying sources to varying destinations, as a customary taxi system does. This is primarily due to the mistaken vision of conveyor systems acting as linear railway networks requiring schedules. On the contrary, conveyor networks are not linear in the sense that they follow rectilinear crossing paths, much like city streets. Such paths are then combined with conveyors capable of autonomously and asynchronously moving large numbers of carriers without collision.

The autonomous conveyor network AMHS combines clean frictionless conveyor principles with a unique network layout to fulfill the logistics requirements of IC manufacturing environments. Mechanical conveyor-to-tool interfaces, also referred to as equipment delivery interfaces (EDi), bridge the conveyor network to individual tools. An operating software module integrates the functionality of the conveyor network and EDi's. The result is a full capability inter-process factory logistics system.

BRIEF DESCRIPTION OF THE DRAWINGS

Illustrative embodiments of the disclosed technology are described in detail below with reference to the attached drawing figures, which are incorporated by reference herein and wherein.

DETAILED DESCRIPTION

The manufacturing of an IC may consist of over a thousand operations performed in sequence on a single substrate wafer. The process sequence takes the substrate wafer through tools numbering hundreds to a thousand or more, in a recursive manner, with tools being used repeatedly in the sequence. During manufacturing, the accumulated processing time in tools may generally be twelve to thirty days, while the time for the substrate wafer to go from start to the finish of manufacturing, also called cycle time, may take three times longer. In general, the logistics infrastructure, the so-called Automated Material Handling System (AMHS), owns the work in process two-thirds of the total cycle time, thus becoming a critical element in manufacturing execution. This extra or overhead time, beyond the actual manufacturing time, is caused by variability in the manufacturing process introduced by dispatch as well as by innate variances. Variabilities in the overall manufacturing process act as resistance to the work in process being forced through the factory. Thus, factory management is justifiably preoccupied with the reduction of such variabilities, and so to minimize the cycle time.

Figure 1:
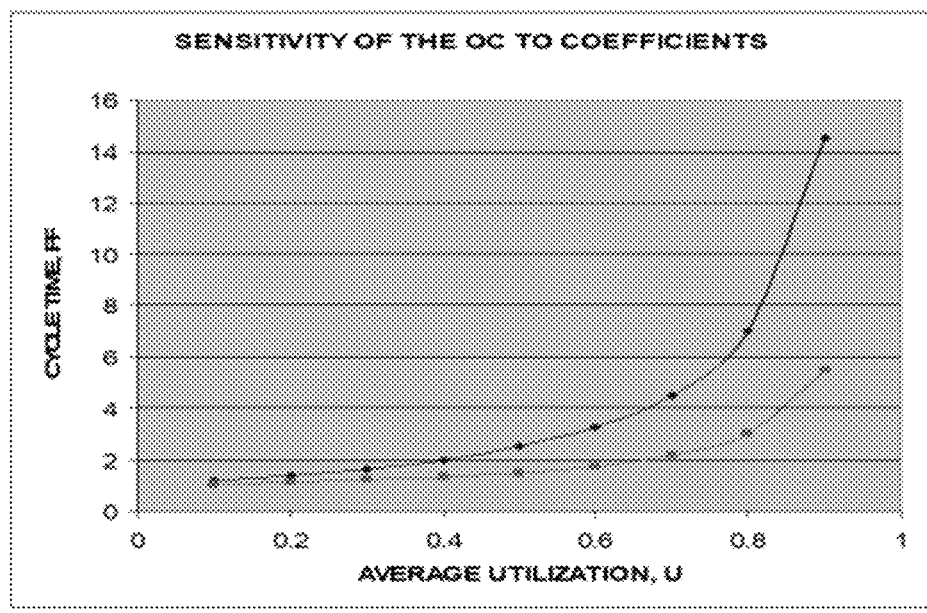
FIG. 1 is a graph illustrating factory operating curves for a prior art transport system and a system according to the present disclosure.

Factory performance is characterized by its operating characteristic, or "OC." This functionally relates the normalized cycle time with the throughput of the factory by the equation $$CT = \alpha\left(\frac{U}{1} - U\right) + 1$$

where CT=cycle time, and α represents the coefficient of variability. See FIG. 1, where the upper curve represents the operating characteristic of a prior art, vehicle-based AMHS. Variabilities may be present in dispatching products throughout the factory, at the process tools, and in the logistics infrastructure. In the present disclosure, the objective of the disclosed logistics is to reduce, or to bypass, variabilities inherent in the prior art vehicle-based AMHS systems, and thus to improve cycle time and factory throughput. This is achieved by a multi-component, integrated conveyor network system, which provides the lower operating characteristic curve in FIG. 1.

Figure 2:
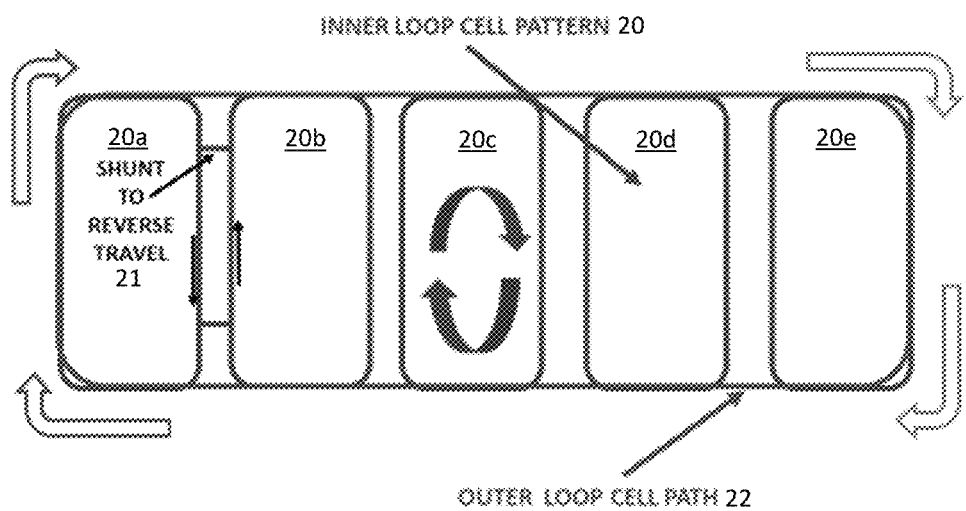
FIG. 2 is a schematic view of a chain of inner transport loops with an outer loop as used within a tool bay according to the present disclosure.

The objective in laying out a transport path within a manufacturing environment is to enable WIP carriers to move from any tool to any other tool in the factory environment in the temporally shortest manner. This can be most efficiently achieved by creating loops of paths within each island or bay of tools, as tools are customarily arranged in islands or cells for functionality. Reference is made to FIG. 2. Each loop 20a-20e associated with a respective bay, also referred to as an intra-bay conveyor loop, has an identical, singular directional path; WIP carriers on each loop within a cell travel, for example, only in a clockwise direction, as illustrated. The loop paths 20 are then concatenated into an aggregation of individual loops, with individual loops neighboring each other. The neighboring loops, while mutually adjacent, do not share any common conveyor segments. Thus, the neighboring intra-bay conveyor loops are said to be proximate to each other but without being coincident with each other.

To enable WIP carriers to be moved along from loop to loop, a circumferential larger frame loop 22, also referred to as an inter-bay conveyor loop, is overlaid around the smaller chain of loops, embracing them as a frame. The outer frame loop thus shares paths at intervals with each of the smaller loops. Leftmost loop 20a shares a majority of its path with the larger frame loop 22, whereas the second leftmost loop 20b shares the top and bottom of its path with the larger frame loop 22. This larger frame loop 22 assumes the same flow direction as the enclosed smaller loops, which is clockwise in the illustrated example of FIG. 2. Where the inter-bay conveyor loop shares conveyor segments with one of the intra-bay conveyor loops, the inter-bay conveyor loop is said to be coincident with the intra-bay conveyor loop. Where the intra-bay conveyor loops 20 neighbor each other, the directions of travel flow in the nearest loop portions oppose one another, as shown by vertical arrows within the leftmost loops 20a, 20b.

At these neighboring locations, at least one shunt or short, bridging conveyor pathway 21 is provided from loop to loop to allow the reversal of the direction of travel of a WIP along the paths. The shunt may be comprised of unidirectional or bidirectional conveying segments at the interface between each loop and the shunt. These unidirectional or bidirectional conveying segments may be referred to as being coincident with both the respective intra-bay conveyor loop and the shunt and selectively enable a WIP to be conveyed forward along the respective conveyor loop or to be moved orthogonal to the respective loop path onto the shunt. The shunt may have one or more linearly conveying conveyor segments between the bidirectional conveying segments. Such segments are discussed further below. In a further embodiment, the shunt may only consist of two bidirectional conveying segments.

Figure 3:
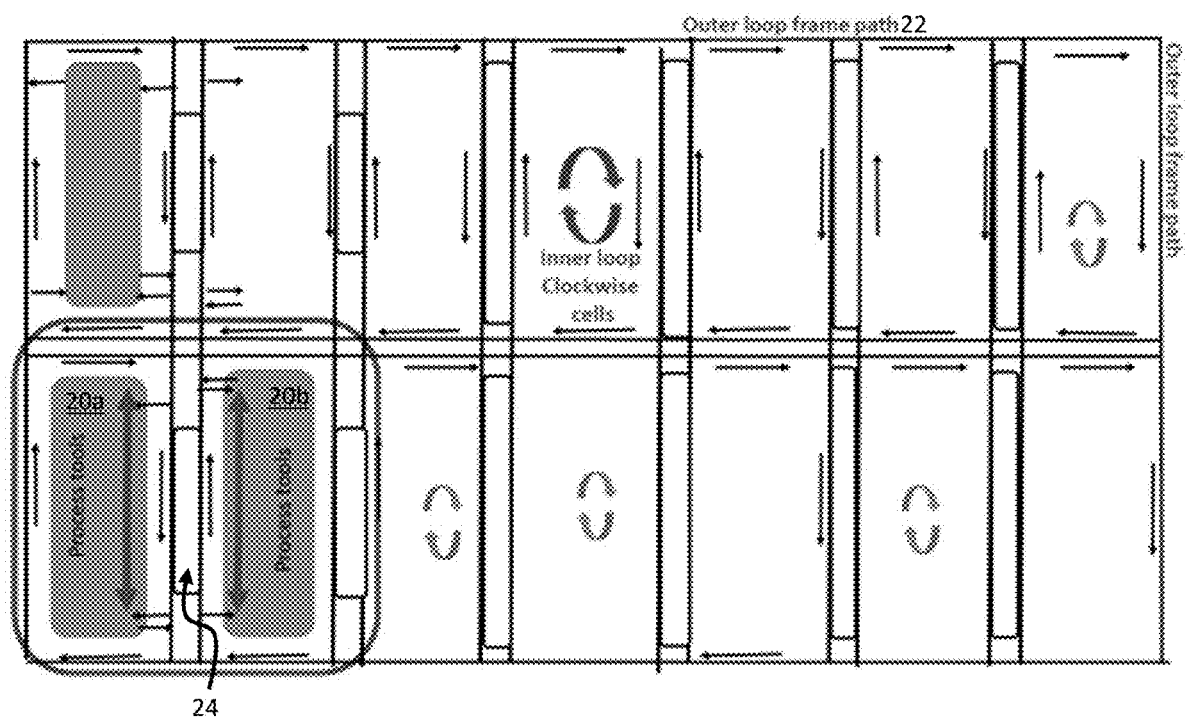
FIG. 3 is a schematic view of plural tool bay transport loops of FIG. 2 framed by an outer loop path.

In FIG. 3, the loop arrangement and method of travel disclosed with respect to FIG. 2 are used to create transport paths in a factory such as an IC manufacturing factory. The transport paths represent conveyor lines forming a network, on which work in process (WIP) carriers will travel, interconnecting most tools in an IC factory. Blocks 20a, 20b indicate bays or cells of tools, possibly as many as ten to thirty. The space between the bays of tools is called intra bay space 24. The tools in the bay of tools face into these intra bay spaces. The face of each tool is equipped with a tool port to receive WIP carriers into the tool. The network of conveyor paths shows the direction of WIP flow.

Figure 4A:
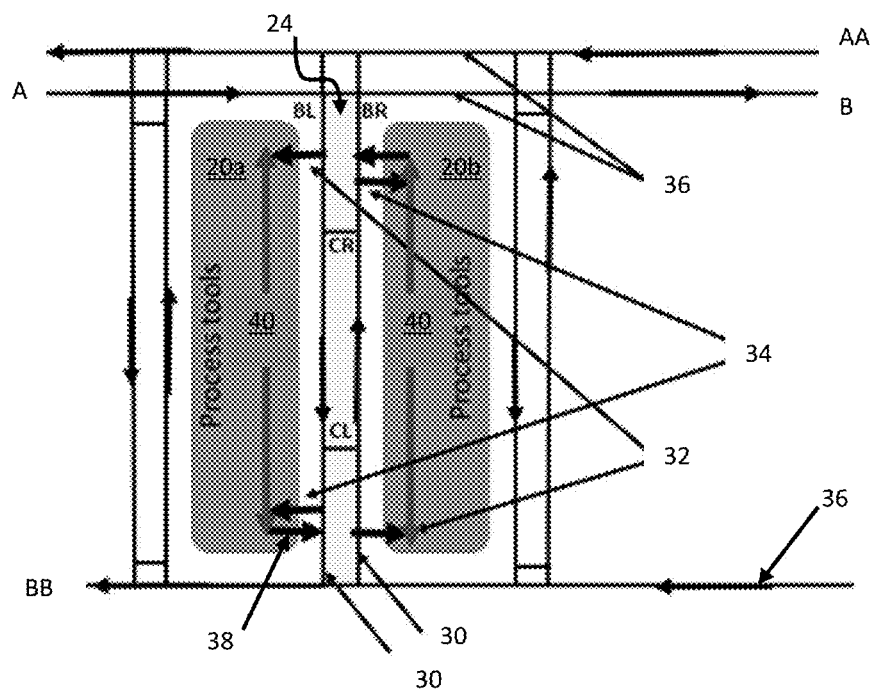
FIG. 4A is a schematic view of a first embodiment of a tool bay transport loop configuration according to the present disclosure.

The two lower leftmost tool bays 20a, 20b in the conveyor network of FIG. 3 are enlarged for clarity in FIG. 4A. This figure shows two bays or cells of tools 20a, 20b, and between these two the intra bay space 24, where WIP carriers are brought to process tools. To understand the use of such a conveyor network for WIP carrier movements, a single WIP carrier will be traced on the network. For example: the WIP carrier may be moving on the conveyor network's inter-bay conveyor line 36, entering the figure at point A. As it approaches the left bay 20a, it will enter into the bay, heading south on the leftmost intra-bay conveyor line 30. If this WIP is a high priority WIP, and the need arises to bypass all other carriers on that intra-bay conveyor line and to enter one of the tools on the left side of the bay, it will be moved onto the left I/O priority output port 32. "Output" in this context is with respect to the respective intra-bay conveyor line 30. Here it will be picked up by the EDi 40 (to be discussed in detail below) and delivered to the tool port of the desired tool (not shown). If this is a nonpriority carrier, then it will continue southward, to the shunt CL, where a decision can be made to transfer the carrier to the right side of the bay to the parallel, northbound intra-bay conveyor 30 associated with the second bay 20b or continue southwards and queue for entry at the normal conveyor I/O port 34 at the bottom of the respective bay 20a. There the EDi 40 will deliver the carrier to the tools. Carriers originating at a tool on the left side of the bay 20a, would be moved by the EDi 40 to the southbound conveyor 30 at the input 38 to that conveyor at the bottom of the bay. From there, the conveyor 30 will move the WIP carrier to the inter-bay line 36 at the bottom and proceed west to point BB.

Carriers entering on the right, from bay 20b, would proceed in similar manner northward on the rightmost intra-bay conveyor 30. Carriers originating at tools and entering the conveyor domain at the port indicated by the top arrow would exit the bay 20b onto the north inter-bay line 36 and proceed east to point B. It is to be emphasized that these are merely examples of the flexibility in WIP carrier movement afforded by a modularized conveyor network as presently disclosed. As seen in FIG. 3, intra-bay conveyors forming the sides of intra-bay conveyor loops may extend across inter-bay conveyor loops, thus forming a shunt between inter-bay conveyors and vertically connecting adjacent intra-bay conveyor loops.

It can be envisioned by those skilled in the art that this carrier logic in the bay allows for carrier delivery as a priority, as a normal straight destination delivery to a FIFO queue of the EDi, and allows for carrier priority reassignment prior to entering the queue at the EDi. With regard to the latter, for example, a carrier could be recirculated by lowering its priority and allowing other carriers to advance in front of it such as by being moved from the southbound intra-bay conveyor 30 to the northbound intra-bay conveyor 30 via shunt CL, moving it north, then moving it back to the southbound intra-bay conveyor 30 via the shunt CR, thereby lining up behind carriers that it had previously been in front of.

The described arrangement for carrier moves are examples, and different applications may call for other conveyor line arrangements and individual movements. For example, there may be multiple conveyor ports and EDi's within a single bay, or multiple shunts between intra-bay conveyors 30. Alternatively, there may be no shunts at all.

Figure 4B:
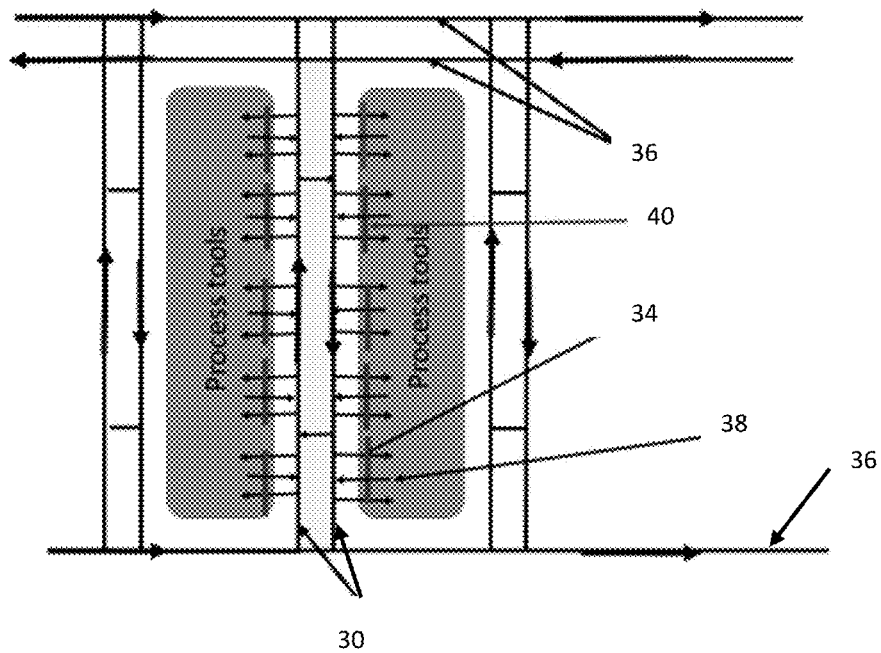
FIG. 4B is a schematic view of a second embodiment of a tool bay transport loop configuration according to the present disclosure.

For example, with respect to FIG. 4B, illustrated are plural I/O ports interfacing with an intra-bay conveyor 30. In this illustrated and non-limiting example, each tool within each bay is provided with two outputs and one input. Again, "output" and "input" in this context are with respect to the intra-bay conveyor 30. Also illustrated in the embodiment of FIG. 4B is a single EDi 40 per tool.

Figure 5A:
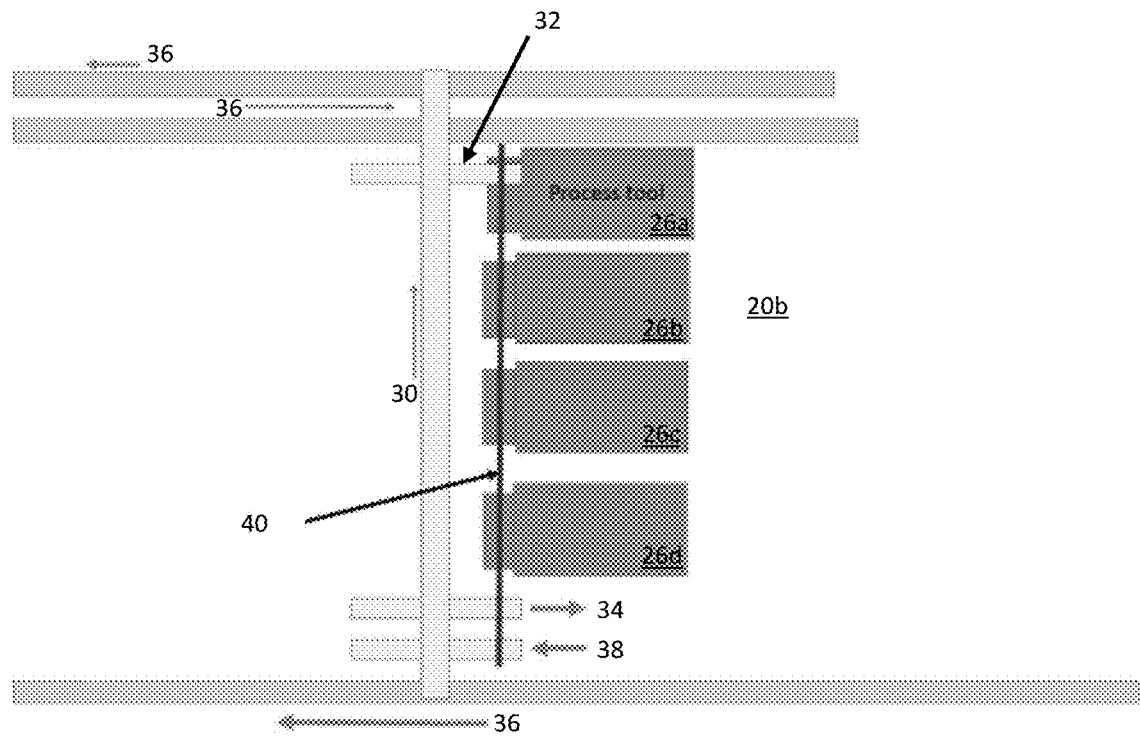
FIG. 5A is a schematic view of a portion of the first embodiment of a tool bay transport loop of FIG. 4A interfacing to an equipment delivery interface (EDi) associated with respective process tools.

A detailed view of a single bay 20b from FIG. 4A is shown in FIG. 5A. Illustrated are inter-bay conveyors 36 which run along the periphery of the bay, an intra-bay conveyor 30, a priority output port 32 (which may also serve as an input port), normal output and input ports 34, 38, one or more EDi's 40, and plural process tools 26a-26d. The EDi's 40 of this figure are shown as comprising a conveyor portion serving as a buffer for the robotic carrier manipulator, to be described in greater detail below.

Figure 5B:
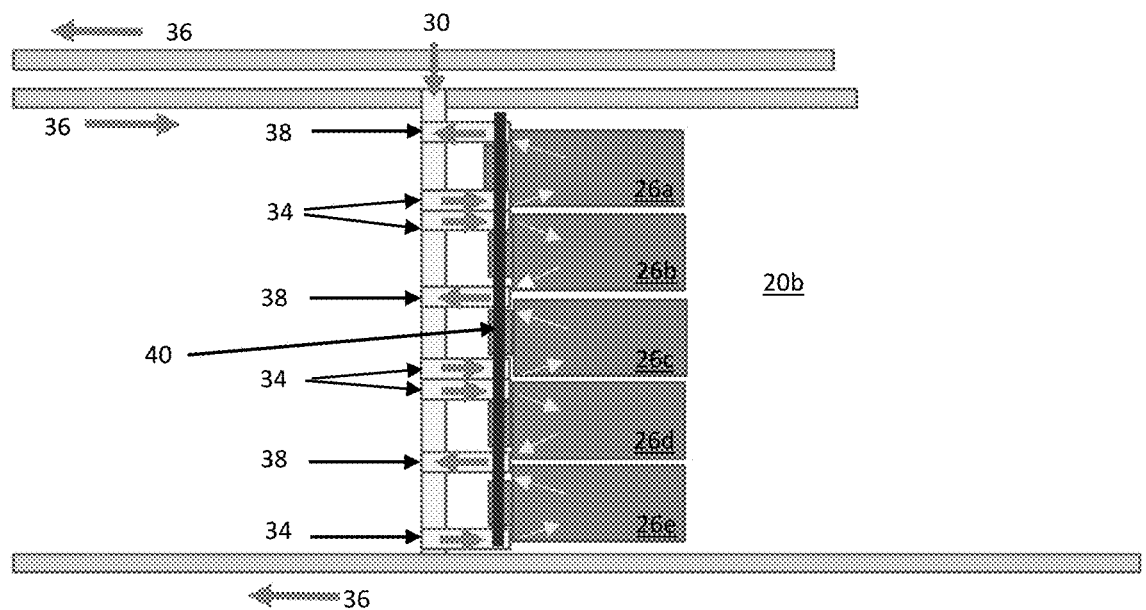
FIG. 5B is a schematic view of a portion of the second embodiment of a tool bay transport loop of FIG. 4B interfacing to an EDi associated with respective process tools.

A detailed view of a single bay 20b from FIG. 4B is shown in FIG. 5B. Illustrated are inter-bay conveyors 36 which run along the periphery of the bay, an intra-bay conveyor 30, output and input ports 34, 38, one or more EDi's 40, and plural process tools 26a-26e.

In one operational embodiment, the EDi has the following prioritized functions. First, it picks up a WIP that has completed processing at a tool from the respective tool port and deposits it onto the associated buffer. If there are no WIP ready to be removed from a tool port, the EDi loads WIP from the associated buffer to a tool port. If there is no room in the associated buffer for a WIP removed from a tool port, then the EDi releases it directly to the conveyor network.

Intra-bay input/output port prioritization in a first embodiment includes unloading a WIP to an input port 38 before releasing a next WIP from the intra-bay conveyor 30 to an output port 34. Buffer capacity is thereby maximized. Tool buffers are kept full if WIP is available. However, if a WIP is finished and available at a tool port, moving it to the next process bay and respective buffer takes the highest priority in order to minimize processing delays.

Figure 6:
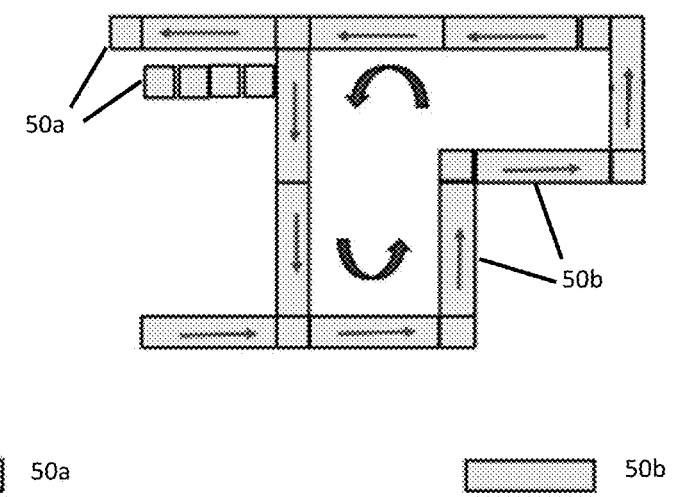
FIG. 6 is a schematic view of modular conveyor network elements according to the present disclosure.

The conveyor transport paths are comprised of individual, sequentially aligned conveyor segments 50 performing collectively as the infrastructure network. In FIG. 6, two lengths of conveyor segments are illustrated. A shortest length segment 50a is the smallest conveyor length as defined by the WIP carrier dimensions. This segment length must be longer than the maximum WIP carrier length. A longer conveyor segment 50b is an integer multiple of the length of the smallest conveyor segment 50a. While segments of two lengths are illustrated, many more segments of different integer multiples may be provided. The segments are geometrically constructed to comply with WIP carrier dimensions, the modularity providing for the flexible construction of the transport paths by aggregating various module lengths divisible by a length characteristic of the approximate WIP carrier. For example, module lengths may be 0.5 m; 1 m; 1.5 m; 2 m, etc. for 300 mm standard wafer carriers. Some conveyor segments may simply move carriers in a linear fashion. Other conveyor segments, such as those disposed at corners of a conveyor path or at intersections between multiple conveyor paths enable multi-directional translation of carriers, including the option of rotating carriers if required.

This segmented modularity functionally satisfies the requirements for natural and easy network construction, as well as enabling an embedded control system to move carriers in an asynchronous, collision-free manner. Accordingly, a conveyor portion or module such as shown in FIG. 6 is segmented into one or more integer numbers of unit conveyor lengths. Each conveyor segments 50a, 50b is provided with respective, independent sensing and drive elements. Sensing may include carrier presence, acceleration or deceleration, speed, and direction. As such, each module may have sensors that detect the presence or movement of carriers via optical detection, inductive sensing, weight sensing, rate of rotation of rotating members upon which a carrier travels within a module, etc.

Sequential conveyor segments 50 are capable of communicating status therebetween. As carriers are moved along the conveyor pathway, each can be moved independently of any other, so long as a downstream conveyor segment is not occupied by a different carrier. Collisions of carriers are thus avoided. This provides for asynchronous carrier movement on the conveyor. The conveyor drive of each segment is constructed so as not to cause relative frictional movement between conveyor drive and WIP carrier during acceleration, deceleration, or constant drive, thus assuring minimal or no particulate generation resulting from friction.

Figure 7:
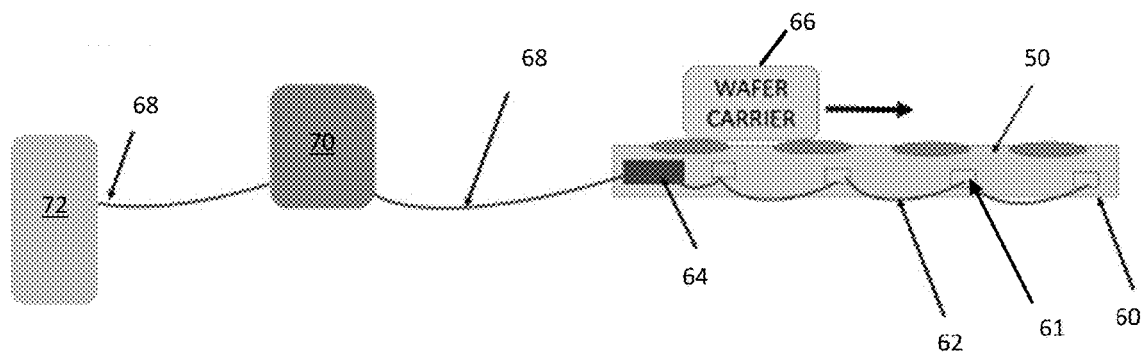
FIG. 7 is a schematic view of the distributed control pathways for a factory transport system and method according to the present disclosure.

Each segment 50 within a conveyor module 60 is individually controlled by respective embedded firmware and hardware. Such a conveyor module may, for example, include the conveyor segments and EDi's associated with contiguous tool bays 20a, 20b and may be referred to as a control zone. With respect to FIG. 7, each conveyor segment includes at least one motor for selectively accelerating, decelerating, running, and stopping a drive member that is coupled to at least one drive belt upon which a carrier may be conveyed. A WIP carrier 66 on the belt(s) may thus be selectively stopped, started and/or advanced with respect to each segment. In one embodiment, a segment motor control board and/or an input/output board(s) 61 associated therewith is programmed with embedded control firmware that controls the autonomous movement of each WIP carrier to a downstream position not occupied by a stationary carrier. Each WIP carrier is autonomously moved forward from segment to segment via the embedded controls, while data associated with the respective carrier, for example carrier destination, ID, etc., is transferred as well.

The controller 64 associated with the respective control zone 60 tracks all WIP carriers within the zone, including a unique identifier of the WIP. Other information associated with the WIP by the control zone controller may include the status of the WIP within the overall processing requirements for that WIP. Once the WIP is conveyed from the respective control zone to the next sequential control zone, the WIP information is passed to from the old control zone controller to the new control zone controller, such as via an Ethernet connection 68. In one non-limiting example, control zones are comprised of approximately 50 conveyor segments, though a higher or lower number of conveyor segments per control zone is envisioned.

While under the control of centralized movement coordination system 72 which integrates WIP movement with other operations within the manufacturing environment such as tool control, overall the dispatch of carriers from carrier input to carrier output points on the network occurs in a distributed manner; the conveyor network is controlled by distributed processors. A functional control hierarchy for the network consists in general of 3 levels. Level 1 is the asynchronous, independent, autonomous, collision-free movement of carriers from conveyor segment 50 to conveyor segment through the functionality embodied in the firmware associated with each segment controller. Level 2 concatenates a large number of such segments into a control zone 60 under control of an embedded processor 64, called a transfer management unit (TMU). This processor tracks all carriers within its zone, together with the carrier associated data. When a carrier exits the zone of such a processor, all data associated with that carrier is passed onto the next neighboring control zone embedded processor. Level 3 of control is called the dispatch controller (DC) 70 which concatenates a large number of embedded TMU processors into an area. This DC connects to other such DC thereby achieving factory-wide integration of the conveyor network and the carriers moving on it. Each DC comprises any number of graphical user interfaces (GUI) displaying carrier movements and providing operator interface to the conveyor-based AMHS network, while also serving as an interface to factory host controls 71.

Communication between conveyor segments 50, including an indication of whether a downstream conveyor segment is occupied by a carrier, is achieved through the use of a communications bus 62, such as a controller area network (CAN) bus, that interconnects controllers 61 of sequential ones of the segments 50. A local zone controller/CPU 64 associated with a control zone of the conveyor 60 communicates with the communications bus 62 on the one hand and with a network communications channel 68 such as an Ethernet connection on the other hand. Data from plural zone controllers is thus gathered by a respective dispatch controller 70 preferably having a graphical user interface GUI. In this manner, a user may monitor, adjust, or otherwise manipulate the performance of the conveyor network as desired. In the illustrated embodiment, the dispatch controller 70 is also in communication with the centralized movement coordination system 72, otherwise referred to as a factory host control, which may be implemented as a machine coordinate system (MCS) or manufacturing execution system (MES), via a network communications channel 68 such as an Ethernet connection. These systems implement centralized control over carrier movement in coordination with, for example, a respective WIP priority, relevant tool status information, and network status information.

Collectively, carrier streaming and collision free accumulation of carriers is enabled, depending on whether stationary downstream carriers are detected. The embedded controls thus substitute for the normally practiced external WIP flow control, which otherwise manages dispatch of carriers, in a manner concurrently reserving free conveyor space for carriers to be sent to a destination, an intrinsically inefficient practice. The presently disclosed embedded control methodology, with the segmentation of the conveyor modules and distributed, local conveyor control, thus achieves a faster, more dense or higher volume WIP flow by filling in all conveyor spaces autonomously, without the need for centrally reserving space for each dispatch to destination.

Logic control software that implements carrier transfer management is resident in embedded, linked, and distributed CPUs, including the segment motor controllers 61 and control zone controllers/CPUs 64. A dispatch controller 70 connects the distributed and embedded logic software to the factory host 72 and to distributed GUIs. Functionally this logic software controls the massively concurrent flow of carriers on the entire conveyor network, where multiple source to destination carrier moves simultaneously transit several branches and branching nodes of the network. The source of a carrier entering the network domain, through an EDi, is one of the hundreds or more of process tools. Similarly, the destination of such a carrier may be any other of the hundreds or more of process tools. While process sequence recipes are determined by the factory host (depending on the IC device being manufactured), their precise execution is made at a local level by the transport network and its embedded software.

EDi is used as the terminology for a module placed between the WIP conveyor transport and the process equipment. Its functionality is for the movement of the WIP carriers from the conveyor, at I/O ports, to the process tool and vice versa. It is a robotic extension of the conveyor network. Each EDi is a part of the domain of the transport network, meaning that WIP carrier moves by the EDi are controlled by the logic software of the conveyor network.

Figure 8:
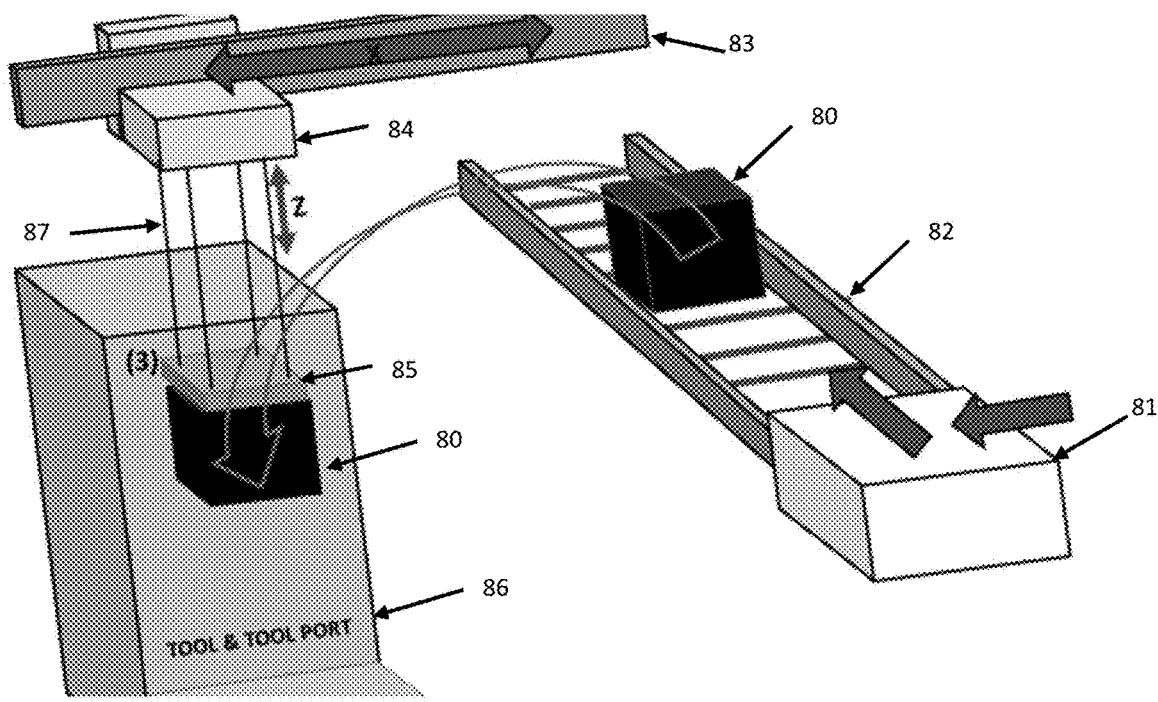
FIG. 8 is a diagrammatic view of an EDi embodiment according to the present disclosure.

With regard to FIG. 8, a carrier 80 is transported by the conveyor network (not shown in FIG. 8) to an I/O port 81 of a tool bay. The carrier is then moved onto a horizontal conveyor pathway 82 that forms a part of the EDi. The carrier is moved laterally, or in the Y axis, until it is disposed beneath a beam 83. A trolley 84 is configured to travel in and out on the beam, which may be defined as the X direction. Suspended beneath the trolley by plural cables 87 is a gripper 85 which is configured to selectively grasp a carrier therebeneath and to move the carrier up and down, which may be defined as the Z axis. The horizontal conveyor pathway, beam, trolley, cables, and gripper collectively comprise the EDi. A CPU may be associated with the EDi for executing locally stored logic control firmware to implement carrier manipulation in concert with the remainder of the conveyor network. Both the conveyor and the EDi controller are connected via a data channel such as Ethernet with the network's centralized dispatch controller. The CPU and control unit for the EDi may be integrated into an EDi component such as the trolley, or may be implemented within a local transfer management unit (TMU) controller that then communicates wirelessly with the EDi, such as via wireless Ethernet or Bluetooth. The EDi, with its own TMU, acts as a TMU zone within the conveyor network.

The trolley 84 thus moves out, over the conveyor pathway 82, then lowers the gripper 85 via the cables 87. The trolley may have motorized spools for raising and lowering the gripper via the cables. For example, the EDi may include a helical wire drum and hoist servo unit. The EDi may be provided with line power or battery power supplied by a battery mounted in conjunction with the trolley 84. Such a battery may be wirelessly chargeable. Once in contact with the carrier 80, the gripper mechanically engages the carrier and lifts the carrier via the cables. The trolley moves in, above the tool and tool port 86, then lowers the carrier to the port.

After the payload is processed by the tool 86, the gripper 85 and trolley 84 of the EDi returns the carrier 80 to the horizontal conveyor pathway 82. The carrier is then transported toward another tool by the conveyor network, and finally delivered to that tool by another EDi which may share the same horizontal conveyor pathway 82. Alternatively, the carrier may then be forwarded to a bay output port and then transferred to a respective intra-bay conveyor. By analogy, the EDi acts as a finger extension of the conveyor network. It performs its function by executing three machine directive types: (1) horizontal moves on a linear beam 83, from conveyor port 81 to tool port 86 and vice versa; (2) vertical moves lowering or lifting WIP carriers at a conveyor 82 and at tool port 86; and (3) gripping carriers by their SEMI standard top "mushroom" features. The gripper may have selectively inwardly projecting fingers (not shown) for engaging such features.

Figure 9:
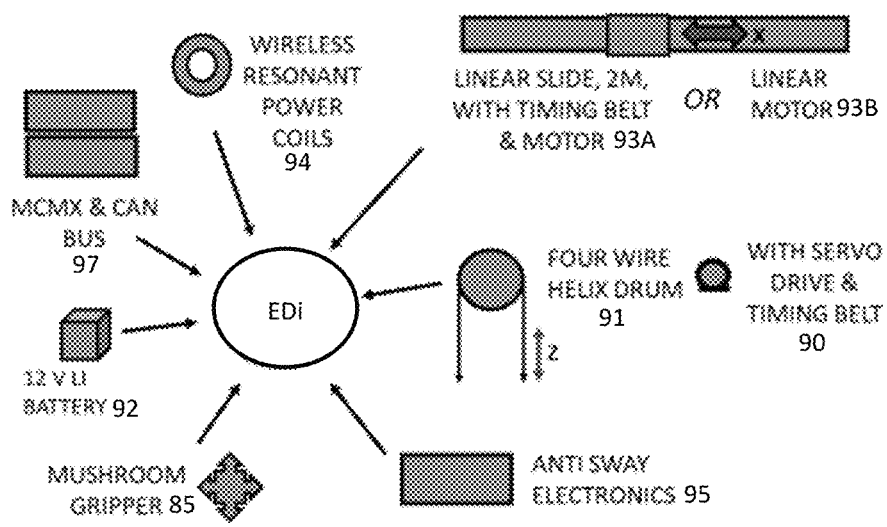
FIG. 9 is a schematic view of components of the EDi embodiment of FIG. 8.

FIG. 9 illustrates exemplary physical elements of the EDi. A servo drive with timing belt 90 is used in conjunction with a four-wire helical drum 91 for manipulating the cables 87 associated with a mushroom gripper 85. Wired power may be provided. Alternatively, wireless power may be provided, in which case the EDi includes wireless resonant power coils 94 in association with a battery 92, such as a 12V lithium ion battery. Communications to and from the local EDi CPU and control unit may be via a machinery control and monitoring system and CAN bus interface 97. Wireless communication for controlling the EDi would also be practiced via a wireless transceiver (not shown). The trolley includes either a linear slide with an associated timing belt and motor 93A or a linear motor 93B. Anti-sway electronics 95 are integrated into the drive mechanisms of the EDi to prevent non-linear movement of a carrier during transport.

In the foregoing discussion, reference has been made to the conveyance of WIP carriers. However, it is to be understood that the present disclosure has applicability to the direct conveyance of WIP, without a carrier, and may also be adapted to the conveyance of a variety of workpieces or carriers.

The foregoing description has been directed to particular embodiments. However, other variations and modifications may be made to the described embodiments, with the attainment of some or all of their advantages. It will be further appreciated by those of ordinary skill in the art that modifications to the above-described systems and methods may be made without departing from the concepts disclosed herein. Accordingly, the invention should not be viewed as limited by the disclosed embodiments. Furthermore, various features of the described embodiments may be used without the corresponding use of other features. Thus, this description should be read as merely illustrative of various principles, and not in limitation of the invention.

Many changes in the details, materials, and arrangement of parts and steps, herein described and illustrated, can be made by those skilled in the art in light of teachings contained hereinabove. Accordingly, it will be understood that the following claims are not to be limited to the embodiments disclosed herein and can include practices other than those specifically described, and are to be interpreted as broadly as allowed under the law.

What is claimed is:

1. An asynchronous logistics system for moving and processing work in process (WIP) within a manufacturing environment comprising plural tool bays, each comprising at least one manufacturing tool for processing WIP, the system comprising:

an inter-process transportation system for selectively moving the WIP between manufacturing tools, the inter-process transportation system being comprised of sequential conveyor segments, each conveyor segment having a respective drive unit for selectively moving WIP on the conveyor segment and a respective controller configured for autonomously and selectively moving WIP at least on the basis of an input from a next successive conveyor segment indicative of the presence or absence of WIP thereon;

plural tool interfaces, each intermediate at least one respective manufacturing tool and the inter-process transportation system, each adjacent at least one respective conveyor segment of the inter-process transportation system, and each having a respective controller for autonomously and selectively moving WIP between the at least one adjacent conveyor segment of the inter-process transportation system and the at least one respective manufacturing tool; and a localized movement coordination system comprised of plural control zones, each control zone comprised of plural sequential conveyor segments and tool interfaces and a respective control zone processor in communication with each of the respective conveyor segment and tool interface controllers, the control zone processor having, for each WIP within the respective control zone, a unique identifier of the WIP and data characteristic of the required movement and processing of the WIP, the control zone processor for selectively controlling the operation of ones of the respective conveyor segments and tool interfaces, thereby influencing the autonomous movement and processing of the WIP within the control zone; and an environment-wide, regionalized movement coordination system comprised of plural regions, each region comprised of plural control zones and a respective dispatch controller in communication with each respective control zone processor and with all other region dispatch controllers of the regionalized movement coordination system for enabling environment-wide coordination of WIP movement and processing.

2. The system of claim 1, wherein each control zone has at least one conveyor segment adjacent a conveyor segment of another control zone for selectively exchanging WIP therebetween.

3. The system of claim 2, wherein when a WIP is exchanged from a conveyor segment of a first control zone to a conveyor segment of a second control zone, the control zone processor of the first control zone communicates to the control zone processor of the second control zone the respective WIP unique identifier and the data characteristic of the required movement and processing of the WIP.

4. The system of claim 1, wherein the inter-process transportation system comprises a plurality of intra-bay conveyor loops, each intra-bay conveyor loop comprised of plural sequential conveyor segments configured to autonomously, selectively move the WIP in one direction about the respective loop.

5. The system of claim 4, wherein each intra-bay conveyor loop further comprises at least one of the plural tool interfaces.

6. The system of claim 5, wherein the at least one manufacturing tool of each tool bay comprises a tool port adjacent a respective tool interface.

7. The system of claim 6, wherein each tool interface is configured to autonomously and selectively relocate a WIP between a respective intra-bay conveyor loop and a tool port.

8. The system of claim 6, wherein the at least one tool interface comprises:
   a lateral buffer conveyor for receiving a WIP from the respective intra-bay conveyor loop and for selectively moving the WIP proximate the at least one manufacturing tool;
   a beam extending above and orthogonal to the lateral buffer conveyor;
   a trolley for selectively traveling on the beam; and
   a gripper suspended from the trolley by plural length-adjustable cables,
   wherein, when the trolley is disposed on the beam above the WIP on the lateral buffer conveyor, the gripper is configured to be lowered by extension of the cables into engagement with the WIP and to mechanically engage the WIP,
   wherein, when the gripper has mechanically engaged the WIP, the gripper is configured to lift the WIP by retraction of the cables and the trolley is configured to travel on the beam whereby the WIP is above a tool port, and
   wherein, when the WIP is above the tool port, the gripper is configured to be lowered by extension of the cables, thereby lowering the WIP to the tool port.

9. The system of claim 6, wherein the at least one tool interface comprises:
   a lateral buffer conveyor for receiving a WIP from the at least one manufacturing tool;
   a beam extending above and orthogonal to the lateral buffer conveyor;
   a trolley for selectively traveling on the beam; and
   a gripper suspended from the trolley by plural length-adjustable cables,
   wherein, when the trolley is disposed on the beam above the WIP at the tool port, the gripper is configured to be lowered by extension of the cables into engagement with the WIP and to mechanically engage the WIP,
   wherein, when the gripper has mechanically engaged the WIP, the gripper is configured to lift the WIP by retraction of the cables and the trolley is configured to travel on the beam whereby the WIP is above the buffer conveyor, and
   wherein, when the WIP is above the buffer conveyor, the gripper is configured to be lowered by extension of the cables, thereby lowering the WIP to the buffer conveyor.

10. The system of claim 4, wherein each intra-bay conveyor loop is proximate to but not coincident with at least one other intra-bay conveyor loop, each of the adjacent intra-bay conveyor loops configured to selectively move WIP in the same direction about the respective loop.

11. The system of claim 10, further comprising at least one conveyor shunt between two adjacent intra-bay conveyor loops, each shunt comprised of two first conveyor segments, each coincident with a respective one of the two adjacent intra-bay conveyor loops, the first conveyor segments configured to selectively move a WIP either onto the next consecutive conveyor segment within the respective intra-bay conveyor loop or to selectively exchange a WIP between the respective intra-bay conveyor loop and the shunt.

12. The system of claim 11, wherein each shunt further comprises at least one second conveyor segment between the two first conveyor segments and configured to selectively move a WIP to a next consecutive conveyor segment within the shunt.

13. The system of claim 4, further comprising at least one inter-bay conveyor loop surrounding and partially coincident with plural intra-bay conveyor loops, the at least one inter-bay conveyor loop configured to selectively move a WIP between intra-bay conveyor loops under control of a respective control zone processor.

14. The system of claim 13, wherein each inter-bay conveyor loop is configured to move WIP in the same direction as the intra-bay conveyor loops with which it is coincident.

15. The system of claim 1, wherein the controller of a first conveyor segment is in communication with the controller of a second, consecutive conveyor segment for receiving second conveyor segment status data indicative of the presence or absence of a WIP on the second conveyor segment, the controller of the first conveyor segment operative to autonomously and selectively move a WIP on the first conveyor segment in response to the second conveyor segment status data, whereby the WIP may be selectively moved to the second conveyor segment without risk of collision with another WIP on the second conveyor segment.

16. The system of claim 1, wherein a respective one of the control zone processors is in communication with the controller of each of the plural conveyor segments within the respective control zone to selectively receive status information therefrom and to selectively provide instructions thereto.

17. The system of claim 16, wherein a first conveyor segment controller is configured to autonomously move a WIP to a second, consecutive conveyor segment upon receipt, from a second conveyor segment controller, of data indicative of the absence of a WIP on the second, consecutive conveyor segment and in the absence of a command from the respective control zone processor instructing the first conveyor segment controller to not move the WIP to the second, consecutive conveyor segment.

18. A method of selectively moving and processing work in process (WIP) within a manufacturing environment comprising plural tool bays, each comprising at least one manufacturing tool for processing the WIP, the method comprising:
   providing an asynchronous logistics system for moving and processing WIP within the manufacturing environment, the logistics system comprising
      an inter-process transportation system for selectively moving the WIP, the inter-process transportation system being comprised of sequential conveyor segments, each conveyor segment having a respective drive unit for selectively moving WIP on the conveyor segment and a respective controller configured for autonomously and selectively moving WIP at least on the basis of an input from a next successive conveyor segment indicative of the presence or absence of a WIP thereon, plural tool interfaces, each intermediate at least one respective manufacturing tool and the inter-process transportation system, each adjacent at least one respective conveyor segment of the inter-process transportation system, and each having a respective controller for autonomously and selectively moving WIP between the at least one adjacent conveyor segment of the inter-process transportation system and the respective manufacturing tool, a localized movement coordination system comprised of plural control zones, each control zone comprised of plural sequential conveyor segments and tool interfaces and a respective control zone processor in communication with each of the respective conveyor segment and tool interface controllers, the control zone having, for each WIP within the respective control zone, a unique identifier of the WIP and data characteristic of the required movement and processing of the WIP, the control zone processor for selectively controlling the operation of ones of the respective conveyor segments and tool interfaces, thereby influencing the autonomous movement and processing of the WIP within the respective control zone, and an environment-wide, regionalized movement coordination system comprised of plural regions, each region comprised of plural control zones and a respective dispatch controller in communication with each control zone processor and with all other region dispatch controllers of the regionalized movement coordination system for enabling environment-wide coordination of WIP movement and processing;

receiving a first WIP on the logistics system; and autonomously and selectively moving the WIP from a first conveyor segment to a second, consecutive conveyor segment by selective actuation of the drive unit of the first conveyor segment by the respective controller at least in part in response to data from the second conveyor segment indicative of the presence or absence of a WIP on the second, consecutive conveyor segment.

19. The method of claim 18, wherein the inter-process transportation system further comprises
 a plurality of intra-bay conveyor loops, each intra-bay conveyor loop logically assigned to a respective control zone and comprised of
  plural sequential conveyor segments configured to autonomously, selectively move WIP in one direction about the respective loop,
  at least one of the plural tool interfaces, and
  a tool port of at least one manufacturing tool adjacent the at least one tool interface,
the method further comprising:
 receiving a WIP by one of the at least one tool interfaces from a conveyor segment of the respective intra-bay conveyor loop; and
 depositing the WIP by the tool interface at the tool port under control of the respective control zone processor.

20. The method of claim 19, wherein each intra-bay conveyor loop is proximate to but not coincident with at least one other intra-bay conveyor loop logically assigned to the same control zone, each of the adjacent intra-bay conveyor loops configured to selectively convey WIP in the same direction about the respective loop, the inter-process transportation system further comprises
 at least one conveyor shunt between two adjacent intra-bay conveyor loops, and
 at least one inter-bay conveyor loop surrounding and partially coincident with the plurality of intra-bay conveyor loops, the at least one inter-bay conveyor loop configured to selectively convey a WIP between intra-bay conveyor loops, the method further comprises controlling select ones of the conveyor segments comprising at least one of the adjacent intra-bay conveyor loops and the at least one inter-bay conveyor loop, by the respective control zone processor, to convey the WIP to one of a conveyor segment adjacent one of the at least one tool interface, one of the at least one conveyor shunts, or a conveyor segment of the at least one inter-bay conveyor loop.

21. The method of claim 20 further comprising communicating, by the respective control zone processor, with the local controller of each of the plural conveyor segments to receive status information therefrom and to selectively provide instructions thereto.

22. The method of claim 21, further comprising determining by a control zone processor, for each WIP within an intra-bay conveyor loop and requiring processing by a manufacturing tool within the intra-bay conveyor loop, a relative priority thereof and selectively controlling at least one of a conveyor shunt, the intra-bay conveyor loop, the inter-bay conveyor loop coincident with the intra-bay conveyor loop, and a tool interface while at the same time individual conveyor segments within the respective control zone autonomously move WIP to subsequent conveyor segments without input from the respective control zone processor.

23. The method of claim 18 further comprising selectively, autonomously moving the WIP from a first conveyor segment to a second, consecutive conveyor segment by selective actuation of the drive unit of the first conveyor segment by the respective controller at least in part in response to the absence of a command from the respective control zone processor instructing the first conveyor segment controller to not move the WIP to the second conveyor segment.

24. The method of claim 18, further comprising autonomously moving a WIP from a first conveyor segment, logically assigned to a first control zone, by the first conveyor segment processor controlling the respective conveyor segment drive unit, to a second conveyor segment, logically assigned to a second control zone, and automatically transferring WIP identifying data and data characteristic of the required movement and processing of the respective WIP from the processor of the first control zone to the processor of the second control zone.

25. The method of claim 18, further comprising receiving an indication at a tool interface controller that a processed WIP has been output at a respective tool port and autonomously moving the processed WIP from the tool port to one of a lateral buffer conveyor associated with the tool interface and a conveyor segment within the respective control zone.

26. The method of claim 25, wherein the tool interface comprises
 the lateral buffer conveyor,
 a beam extending above and orthogonal to the lateral buffer conveyor;

a trolley for selectively traveling on the beam; and a gripper suspended from the trolley by plural length-adjustable cables, the method further comprising, when the trolley is disposed on the beam above the WIP at the respective tool port, lowering the gripper by extension of the cables into engagement with the WIP and mechanically engaging the WIP, lifting the WIP by retraction of the cables, moving the trolley on the beam until the WIP is above the lateral buffer conveyor, lowering the gripper by extension of the cables, thereby lowering the WIP to the lateral buffer conveyor.

27. The method of claim 26, further comprising receiving an indication at a tool interface controller that a WIP is on the lateral buffer conveyor and requires movement to a respective tool port and autonomously moving the WIP from the buffer conveyor to the tool port.

28. The method of claim 27, wherein the tool interface comprises the lateral buffer conveyor, a beam extending above and orthogonal to the lateral buffer conveyor;

a trolley for selectively traveling on the beam; and a gripper suspended from the trolley by plural length-adjustable cables, the method further comprising, when the trolley is disposed on the beam above the WIP on the buffer conveyor, lowering the gripper by extension of the cables into engagement with the WIP and mechanically engaging the WIP, lifting the WIP by retraction of the cables, moving the trolley on the beam until the WIP is above the tool port, and lowering the gripper by extension of the cables, thereby lowering the WIP to the tool port.

\* \* \* \* \*